United States Patent [19]

Brokaw

[11] Patent Number: 5,095,274
[45] Date of Patent: Mar. 10, 1992

[54] TEMPERATURE-COMPENSATED APPARATUS FOR MONITORING CURRENT HAVING CONTROLLED SENSITIVITY TO SUPPLY VOLTAGE

[75] Inventor: A. Paul Brokaw, Burlington, Mass.

[73] Assignee: Analog Devices, Inc., Norwood, Mass.

[21] Appl. No.: 410,988

[22] Filed: Sep. 22, 1989

[51] Int. Cl.$^5$ .............................. G01R 31/22
[52] U.S. Cl. .................. 324/414; 324/503; 324/522; 324/537; 324/550; 340/641
[58] Field of Search ............ 324/414, 403, 503, 511, 324/522, 537, 550, 556; 340/641, 642; 307/10.8

[56] References Cited
U.S. PATENT DOCUMENTS

| | | | |
|---|---|---|---|
| 3,344,343 | 9/1967 | John | 324/428 |
| 3,401,337 | 9/1968 | Beusman et al. | 324/428 X |
| 3,727,074 | 4/1973 | Keller et al. | 324/428 X |
| 3,971,980 | 7/1976 | Jungfer et al. | 324/428 |
| 4,013,947 | 3/1977 | Arai | 324/503 |
| 4,354,155 | 10/1982 | Speidel et al. | 324/503 X |
| 4,884,033 | 11/1989 | McConchie, Sr. | 324/503 |

Primary Examiner—Kenneth A. Wieder
Assistant Examiner—Robert W. Mueller
Attorney, Agent, or Firm—Wolf, Greenfield & Sacks

[57] ABSTRACT

An apparatus for monitoring current through a lamp circuit that uses a series resistance shunt in the circuit with one end being connected to a current source and the second end being connected to the lamp. The circuitry includes a comparator that is connected across the shunt and has a threshold switching voltage such that a voltage across the shunt that is larger than the threshold voltage will switch the comparator on (as in the case where the lamp is not functioning) and a voltage across the shunt that is smaller than the threshold voltage (as in the case where the lamp is in the circuit and functioning) will switch the comparator off. In a preferred embodiment, the shunt is actually a portion of the printed circuit board trace. In order to compensate for changes in resistance in the shunt that occur as the temperature of the printed circuit board trace changes, temperature compensation circuitry is included to maintain the threshold switching voltage in a fixed relationship with the temperature of the shunt. The apparatus incorporates additional circuitry connected to the comparator in order to decrease the sensitivity of the comparator to changes in the circuit supply voltage. In a preferred embodiment, the circuit has a 50% sensitivity to supply voltage changes. The circuit may be manufactured in monolithic integrated circuit form in order to enhance reliability, cost, and manufacturability.

21 Claims, 5 Drawing Sheets

FIG. 9

TEMPERATURE-COMPENSATED APPARATUS FOR MONITORING CURRENT HAVING CONTROLLED SENSITIVITY TO SUPPLY VOLTAGE

FIELD OF THE INVENTION

The present invention relates generally to circuits for monitoring current. More particularly, the present invention relates to a monolithic integrated circuit that can be used to detect faulty lamps in automobile electrical systems.

DISCUSSION OF THE PRIOR ART

In automobile lighting systems, it is often desirable to be able to monitor the condition of various external vehicle lamps in order to determine whether or not a lamp is functional. It is also desirable to be able to test the fuses which supply various lighting circuits in the automobile to determine whether or not the fuses are good. The purpose of monitoring the condition of the various signal and warning lamps in the automobile is to alert the driver of a failure of any one of these lamps. Obviously, the failure of a warning or signal lamp in the automobile poses a safety hazard.

In the prior art, the lamp monitoring function has usually been accomplished using a current comparator. The curent comparator simply monitors the current in an active lamp supply circuit to determine whether or not the current drawn by the load is above a predetermined threshold. A current above the predetermined threshold indicates that the lamp is functioning while a current below the threshold indicates a lamp failure. However, there have been several problems with these earlier comparator systems. First, the threshold voltage used to provide the switching threshold that determines whether or not a lamp is on is a relatively high voltage that may vary over a relatively large range. The poor definition and variation of the threshold voltages occurs because of temperature changes and inappropriate sensitivity to changes in the supply voltage.

Second, the current measurement shunts presently used are physically large and have a very large current carrying capacity. The large size and capacity of the current measurement shunts is required in order to enable the system to operate over the full range of supply voltage from the battery. The battery voltage varies widely, depending on the state of charge of the battery, the load being placed on the electrical system, and the temperature of the battery and other components in the electrical system. These large current shunts present an additional problem, in that voltages developed across them are large while some of the current measurements that are being made are relatively small. Furthermore, the large shunts are a source of heat which disturbs the operation of the circuit.

A third disadvantage of the prior art current comparators lies in the fact that these current measurement shunts may be connected through large capacity fuses. Conditions arise in which large currents pass through the fuses, and the current measurement shunts, that actually cause the shunts to heat up and melt the solder that connects the shunts to the circuit. This, of course, causes total failure of the current measuring apparatus and of the lamp circuit itself.

A final disadvantage of the prior art lamp monitoring circuits is that the shunts are generally a special metal material which is relatively expensive. The shunts are also discrete components which have to be inserted and connected into the circuit. These large shunts take up room on the printed circuit board and so are a significant item of cost.

Therefore, an object of the present invention is to provide a current comparator apparatus in which the switching threshold voltages are smaller so as to decrease the required sensing voltage, and therefore the shunt resistance and resulting heating.

Another object of the present invention is to provide a current comparator apparatus that uses the printed circuit board traces as the shunt resistance, so as to eliminate large, discrete, and expensive shunt components.

Yet another object of the present invention is to provide a current comparator apparatus that tracks the change in resistance of the printed circuit board traces that occurs with temperature so that the circuit threshold voltage tracks the temperature change.

Yet another object of the present invention is to provide c comparator apparatus with an appropriate, controlled sensitivity to changes in the supply voltage.

A further object of the present invention is to provide a current comparator apparatus in monolithic integrated circuit form that is reliable, inexpensive, and easy to manufacture.

SUMMARY OF THE INVENTION

The foregoing and other objects and advantages of the present invention are achieved in an apparatus for monitoring current through a lamp circuit that uses a series resistance shunt in the circuit with one end being connected to a current source and the second end being connected to the lamp. The circuitry includes a comparator that is connected across the shunt and has a threshold switching voltage such that a voltage across the shunt that is larger than the threshold voltage will switch the comparator on (as in the case where the lamp is in the circuit and functioning) and a voltage across the shunt that is smaller than the threshold (as in the case where the lamp is not and functioning) will switch the comparator off. In a prefered embodiment, the shunt is actually a portion of the printed circuit board trace. In order to compensate for changes in resistance in the shunt that occur as the temperature of the printed circuit board trace changes, temperature compensation circuitry is included to maintain the threshold switching voltage in a fixed relationship with the temperature of the shunt.

The apparatus incorporates additional circuitry connected to the comparator in order to control the sensitivity of the comparator to changes in the circuit supply voltage. In a preferred embodiment, the circuit has a 50% sensitivity to supply voltage changes. The circuit may be manufactured in monolithic integrated circuit form in order to enhance reliability, cost, and manufacturability.

The foregoing objects, features, and advantages of the present invention will be more readily understood and apparent from the following detailed description of the invention, which should be read in conjunction with the accompanying drawing, and from the claims which are appended at the end of the detailed description.

DETAILED DESCRIPTION

For purposes of illustration only, and not limit generality, the present invention will now be explained with reference to its use in the electrical system of an automobile. However, one skilled in the art will appreciate that the features and functions of the invention are useful in applications outside of automobile electrical systems.

Figure 1:
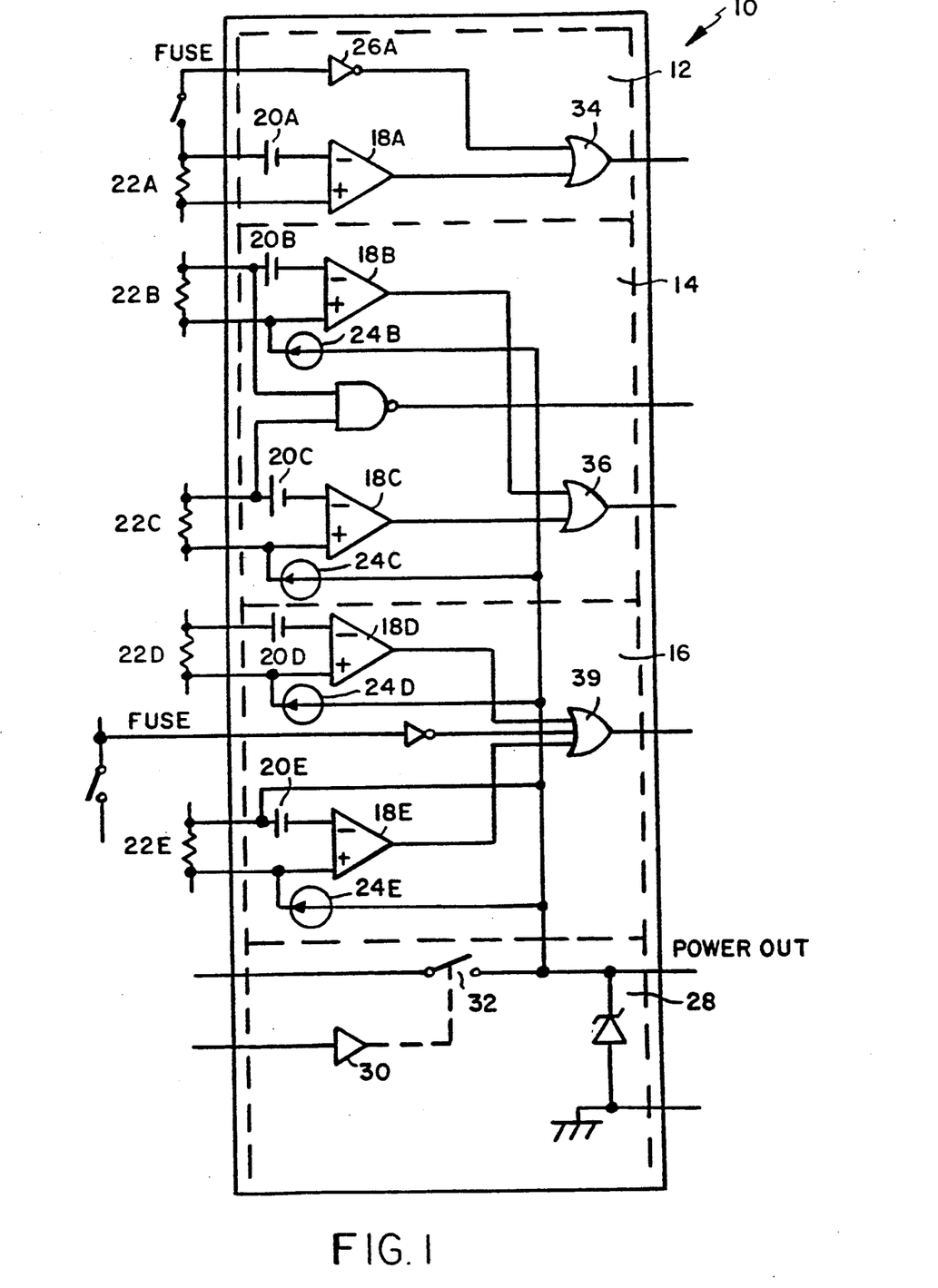
FIG. 1 is an overall functional block diagram of the lamp monitoring apparatus of the present invention.

FIG. 1 shows an integrated circuit 10 of the present invention. The integrated circuit includes comparator modules 12, 14, and 16. Comparators 18A through 18E use identical circuitry. Each comparator measures the voltage developed across the respective shunts 22A through 22E in order to determine whether the voltage sensed is above or below a preset voltage threshold. The threshold voltage is supplied by a circuit drawn functionally as batteries 20A through 20E. In a preferred embodiment, the shunts 22A through 22E are actually portions of the printed circuit board traces. An additional feature of the apparatus of the present invention are current sources 24B through 24E. These current sources allow the circuit to test the lamp circuits "cold"; that is, when they are not turned on. Additional circuits 26A and 26B are included which test for the presence of an in-line fuse in the circuit. The integrated circuit 10 also contains module 28, which is used to control the voltage supplied to the circuits within the chip and to switch the chip on and off, using a signal applied to circuit 30 which activates switch 32.

In circuit 12, output circuit 34 outputs a signal if either fuse test circuit 26A or comparator 18A register a signal. In circuit 14, output circuit 36 outputs a signal if either comparator 18B or comparator 18C register a signal. An additional feature of module 14 is circuit 38 which outputs a signal when the inputs to comparators 18B and 18C are both active. In circuit 16, output circuit 39 is used to output a signal if either comparator 18D, fuse test circuit 26B, or comparator 18E registers a signal.

Shunts 22A through 22E are connected respectively to comparators 18A through 18E, so that the non-inverting input to each comparator is connected to the load or lamp side of each circuit, and the inverting input of each comparator is connected to the supply or battery side of each circuit.

Figure 2:
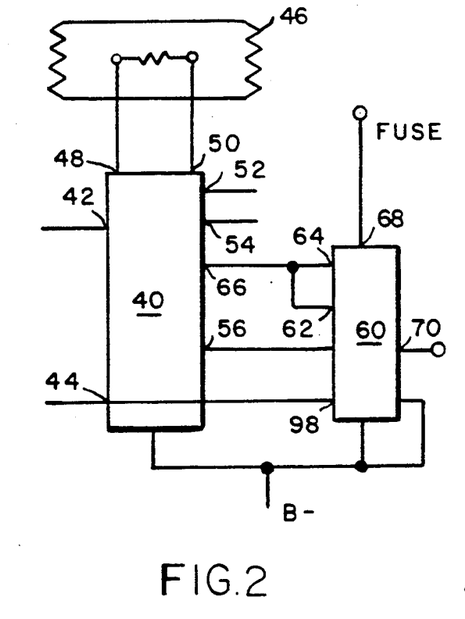
FIG. 2 is a schematic block diagram of the basic comparators used in the circuit of FIG. 1.

FIG. 2 shows, in schematic block diagram form, an apparatus that may be used to implement the functions illustrated in FIG. 1. Comparator 40 is the basic comparator apparatus that determines whether the voltage generated across the shunt resistance exceeds the threshold voltage. Comparator 40 receives bias current from a bias circuit, to be described later, at terminals 42 and 44. The shunt resistance which, in the preferred embodiment is actually a portion of a printed circuit board trace, is shown at 46. The shunt is connected to comparator 40 at terminals 48 and 50. Terminals 52 and 54 are terminals for connections to be described later. The comparator output is provided at terminal 56, which is connected to terminal 58 of fuse test/output circuit 60. Output circuit 60 provides feedback through terminals 62 and 64 to terminal 66 of comparator 40. The fuse to be tested is connected to terminal 68 of fuse test circuit 60. The output of fuse test/output circuit 60 is provided at terminal 70 and may be used to control a suitable indicator on the dashboard of the automobile.

Figure 3:
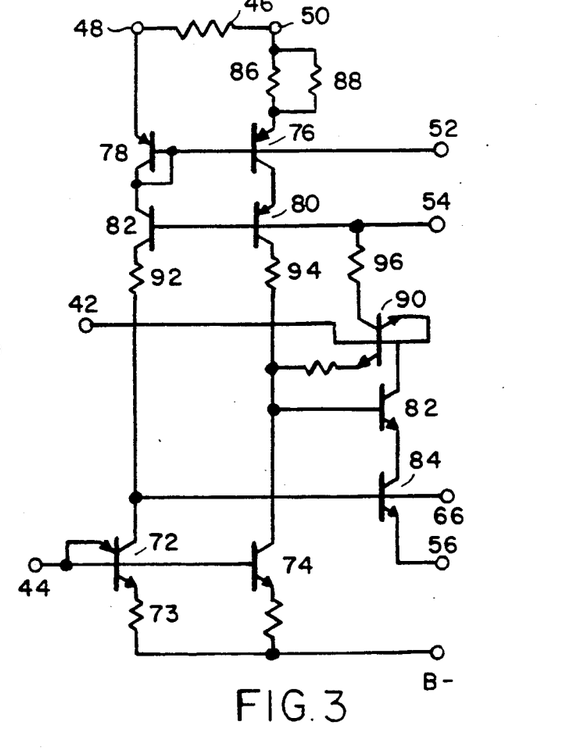
FIG. 3 is an illustrative schematic diagram of a basic comparator circuit shown in FIG. 2.

FIG. 3 shows an illustrative schematic diagram which may be used to perform the functions of comparator 40 in FIG. 2. The circuit of FIG. 3 compares the voltage developed across the shunt resistance 46 with a predefined switching voltage threshold. Input terminals 48 and 50 are connected to the lamp monitoring shunt 46. The threshold switching voltage for the comparator is generated as follows. Bias circuitry within the integrated circuit, which will be explained in greater detail later, sets the bias voltage at terminal 42 to approximately 2.5 Volts and the voltage at terminal 44 at approximately 0.7 Volts. The voltage at terminal 44 causes transistors 72 and 74 to operate with matching, currents of about 10 uAmp each, respectively. The 10 uAmp bias current from transistor 74 is also present in parallel-connected resistors 86 and 88, thus producing a small offset voltage. When the voltage across the shunt at terminals 48 and 50 is equal, the offset voltage developed across resistors 86 and 88 causes transistor 84 to turn on and to drive output terminal 56 positive. As the voltage at terminal 48 decreases because of the voltage drop developed across the shunt resistance, there will come a point at which the negative voltage at terminal 48 exceeds the bias voltage developed across resistors 86 and 88 and consequently, the output will switch off.

PNP transistors 76, 78, 80, and 82 together wit NPN transistor 90 form a current mirror. This current mirror replicates the current supplied by transistor 74 and supplies this current to the base of output transistor 84, when the emittter voltages of transistors 76 and 78 are equal.

If the voltage across shunt 46 makes the emitter of transistor 78 more positive than the emitter of transistor 76, as in the case where the lamp is not functioning properly, the current output by transistor 82 will exceed the collector current of transistor 72. Consequently, the base of transistor 84 will be driven positive and transistor 84 will be turned on. On the other hand, if the voltage across shunt 46 cause the emitter of transistor 78 to become more negative than the emitter of transistor 76, as in the case where the lamp is on and functioning, the collector current of transistor 72 will exceed the collector current of transistor 82. Consequently, the base of transistor 84 will be driven more negative and transistor 84 will be shut off. The output of transistor 84 is taken at its emitter, which is connected to terminal 56.

Transistor 90 provides base current to the current mirror circuit created by transistors 76, 78, 80, and 82 while the collector voltage of transistor 74 near the collector voltage of transistor 72. Transistor 82 replicates the base current being applied to transistor 84 and sends this additional base current to the collector of transistor 74 iva the current mirror. This additional current prevents the base current of transistor 84 from unbalancing the comparator. This additional current is also present in resistors 86 and 88 and produces a small amount of positive feedback, which occurs repeatably at the balance point of the circuit.

Resistors 92, 94, and 96 are provided to limit currents in the event of a transient voltage in excess of the transistor breakdown voltage.

In order to be able to use the printed circuit board trace as the shunt resistance for the comparator circuit, the circuit must track the change in resistance that occurs in the shunt resistance material as the temperature of the printed circuit board trace changes. If copper is used as the trace material, over the expected temperature range of operation, copper has a temperature coefficient of about 3770 PPM/° C. This is slightly greater than a PTAT (Proportional To Absolute Temperature) characteristic, which is on the order of 3400 PPM/° C. The bias circuit, which will be explained in greater detail later, is designed so that the bias voltage at terminal 44 is proportional to absolute temperature. The difference between the PTAT characteristic and the desired temperature coefficient of copper is compensated for by making resistor 88 in the comparator a diffused resistor. The positive temperature coefficient of the diffused resistor combines with the PTAT current delivered by the bias circuit, so that the voltage across resistors 86 and 88 varies in the same manner as the voltage across the copper shunt resistance.

Figure 4:
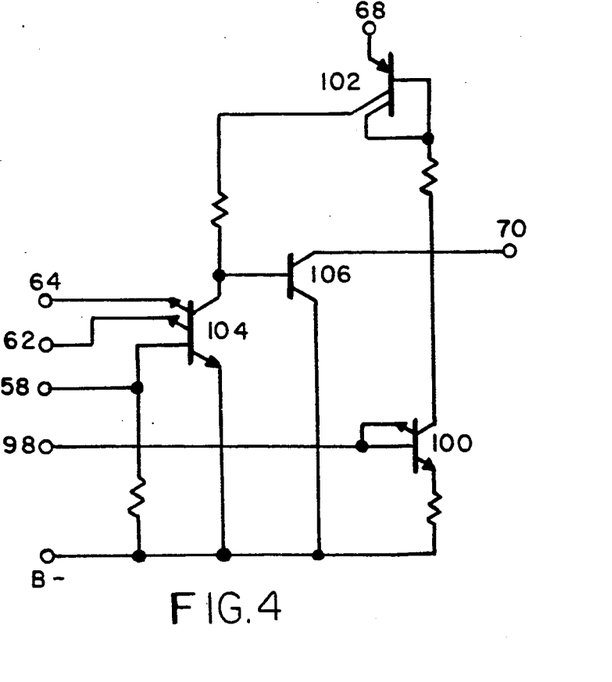
FIG. 4 is an illustrative schematic diagram of a fuse test/output circuit, also illustrated in FIG. 2.

Referring to FIG. 4, the operation of the fuse test/output circuit 60 of FIG. 2 will now be explained. FIG. 4 is an illustrative schematic diagram of a circuit that performs the functions of the fuse test/output circuit 60.

Bias terminal 98 (which is connected to terminal 44 as shown in FIG. 2) is supplied with a voltage that causes transistor 100 to control the current in transistor 102. This current is approximately 50 uAmp. When transistor 104 is off, as in the case where the lamp cicuit being monitored by comparator 40 is off, the current necessary to turn on output transistor 106 comes from a collector of transistor 102. When transistor 106 is on, the output at terminal 70 indicates that the fuse and lamp are functional. To provide for the fuse test feature, terminal 68 must be at a positive voltage in order to mirror the current from transistor 100 to thereby turn on transistor 106. Terminal 68 is thus connected the load or more negative side of the fuse. Whether or not the lamp circuit is in operation, the load side of the fuse should be at or near the battery voltage. If the fuse has failed, then no current will be available from transistor 102 to switch transistor 106 on, and therefore transistor 106 will remain off, indicating a failure at terminal 70.

When the comparator circuit is driving output circuit 60, the output of comparator circuit 40 is connected to the fuse test/output circuit at terminal 58. The voltage at terminal 58 turns transistor 104 on, which turns transistor 106 off, indicating that one or more of the lamps being monitored are non-functional. The additional emitters of transistor 104 act as inverted collectors to provide current limiting feedback at terminals 62 and 64 which are connected to terminal 66 as shown in FIGS. 2 and 3. This feedback is used to limit the current delivered by output transistor 84 shown in FIG. 3.

Figure 5:
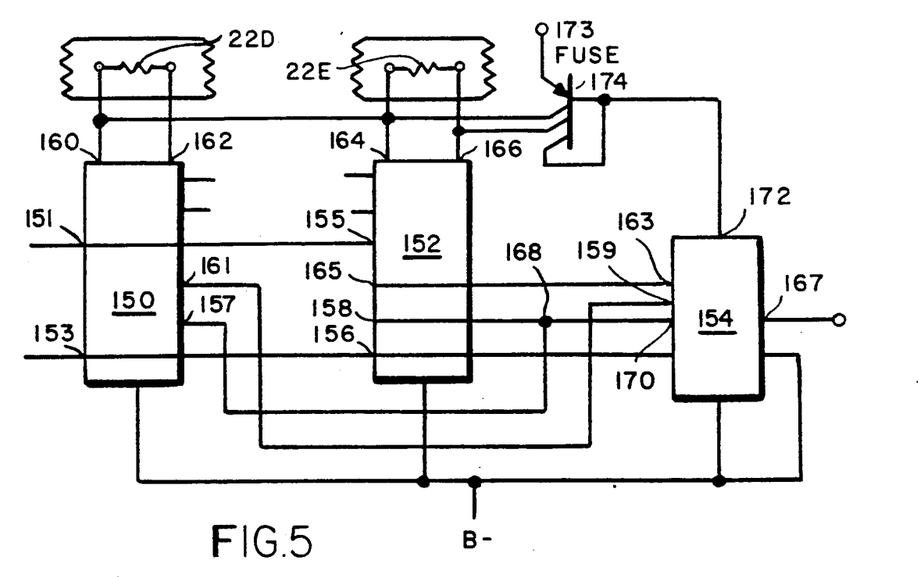
FIG. 5 is an illustrative block diagram of another comparator circuit used in the apparatus of FIG. 1.

FIG. 5 illustrates, in schematic block diagram form, a circuit which may be used to perform the functions described in conjunction with module 16 of FIG. 1. Comparators 150 and 152 function in essentially the same manner as previously described comparator 40. In addition, fuse test/output circuit 154 functions essentially the same as previously described fuse test/output circuit 60. In the circuit illustrated in FIG. 5, shunt resistances 22D and 22E are connected, respectively, across terminals 160, 162 and 164, 166. Bias power is supplied to comparator 150 through terminals 151 and 153 and to comparator 152 through terminals 155 and 156. Output terminals 157 and 158 are connected to the input terminal 170 of output circuit 154 at point 168. Feedback current from output circuit 154 is supplied from terminal 159 to terminal 161 of comparator 150 and from terminal 163 to terminal 165 of comparator 152. The output for this circuit is provided at terminal 167. This circuit essentially monitors two separate lamp circuits and provides an indication if a lamp in either one or the other of the circuits being monitored has failed. Indication of a failure is provided by the wired-OR connection illustrated at point 168 that controls terminal 170 of fuse test/output circuit 154.

Additionally, the circuit illustrated in FIG. 5 provides a "cold" test function. That is, the circuit provides for testing of the lamps when the lamps are in an "off" state, in order to determine whether a lamp is in a respective circuit and whether or not that lamp is functional. To provide this function, terminal 172 of fuse test/output circuit 154 is connected to the base of controlled beta transistor 174. The fuse, which would normally be connected to terminal 172, is now connected to the emitter of transistor 174 at terminal 173. Transistor 174 can still be used as a fuse test circuit, since, in the event of a fuse failure, no power will arrive at terminal 172 of fuse test/output circuit 154 and, thus, the circuit will operate essentially in the same manner as described with respect to fuse test/output circuit 60.

The additional collectors of transistor 174 are used to make a "cold" lamp test. Normally, when the lamps in the respective circuits are switched off, their low resistance keeps the common mode voltage on the respective shunt resistances close to zero. Consequently, the small current from the collectors of transistor 174 does not develop enough of a common mode voltage to operate the comparator. If the lamp is burned out or missing, however, this current would be enough to bias the comparator into operation and, consequently, comparator 150 or 152 will signal a lamp failure.

Figure 6:
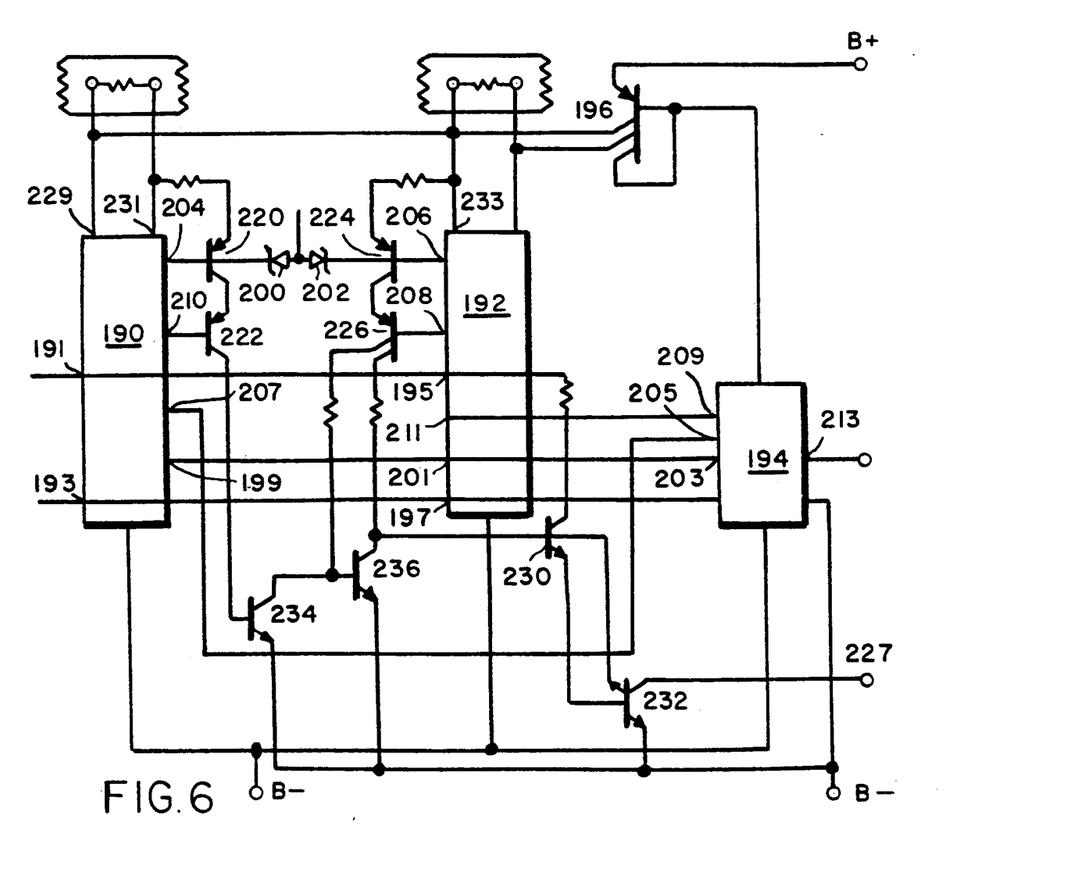
FIG. 6 is a further illustrative schematic block diagram of another comparator used in the apparatus of FIG. 1.

Referring to FIG. 6, there is shown a schematic block diagram of a circuit which performs all of the functions of the circuit illustrated in FIG. 5, except for the fuse test function, and additionally provides several other functions. This circuit may be used to perform the functions illustrated in module 14 of FIG. 1.

Comparators 190 and 192 are the same as and operate in essentially the same manner as comparator 40, already described in connection with FIGS. 2 and 3. In addition, fuse test/output circuit 194 is essentially the same as and operates in basically the same fashion as the fuse test/output circuit already described in connection with FIGS. 2 and 4. In the circuit of FIG. 6, transistor 196 provides the cold lamp test function.

Bias power is supplied to comparator 190 through terminals 191 and 193 and to comparator 192 through terminals 195 and 197. Output terminals 199 and 201 are connected to the input terminal 203 of circuit 194. Feedback current from output circuit 194 is supplied from terminal 205 to terminal 207 of comparator 190 and from terminal 209 to terminal 211 of comparator 192. The output for this circuit is provided at terminal 213.

The Zener diodes 200 and 202 link the two comparators at terminals 204 and 206. Terminals 204 and 206 correspond respectively to terminal 52 of comparator 40, previously described. The conducting path created by Zener diodes 200 and 202 is activated when the voltage across the path reaches approximately 8 Volts. Since the lamps that are being monitored by the pair of comparators 190 and 192 are intended to be operated together, if one lamp is turned on without the other lamp coming on as well, the cross-connecting link formed by Zener diodes 200 and 202 will increase the threshold switching voltage of the comparator that is monitoring the lamp which has come on, thereby causing it to signal a problem.

Terminals 208 and 210 correspond respectively to terminal 54 of comparator 40, described in connection with FIGS. 2 and 3. Transistors 220 and 222 act as a cascode connected current source. Transistors 224 and 226 also act as a cascode connected current source. Transistor 226 is provided with two collectors, in order to provide two current outputs. If both of the lamps that are being monitored by comparators 190 and 192 come on, transistor 230 will be switched on, which will in turn switch transistor 232 on. The output of transistor 232 will consequently be driven low, which indicates that both lamps have been switched on.

When the lamp being monitored by comparator 190 is on, the output of transistor 222 turns on transistor 234, thereby causing transistor 236 to remain off. If the lamp being monitored by comparator 192 is on as well, collector current from transistor 226 will be supplied the base of transistor 230 until it causes transistor 232 to saturate. If, on the other hand, the lamp being monitored by comparator circuit 192 is off, no collector current will be provided by transistor 226 to transistor 230, and therefore the output of transistor 232 will be high, indicating that one of the lamps is not functioning. Finally, if the lamp being monitored by comparator circuit 192 is on alone, transistor 234 will be not be turned on, so the current from the second collector of transistor 226 will keep transistor 236 on. This will turn off transistors 230 and 232 so that the output of transistor 232 will be high, thereby indicating that one or both lamps have not been driven on.

Figure 7:
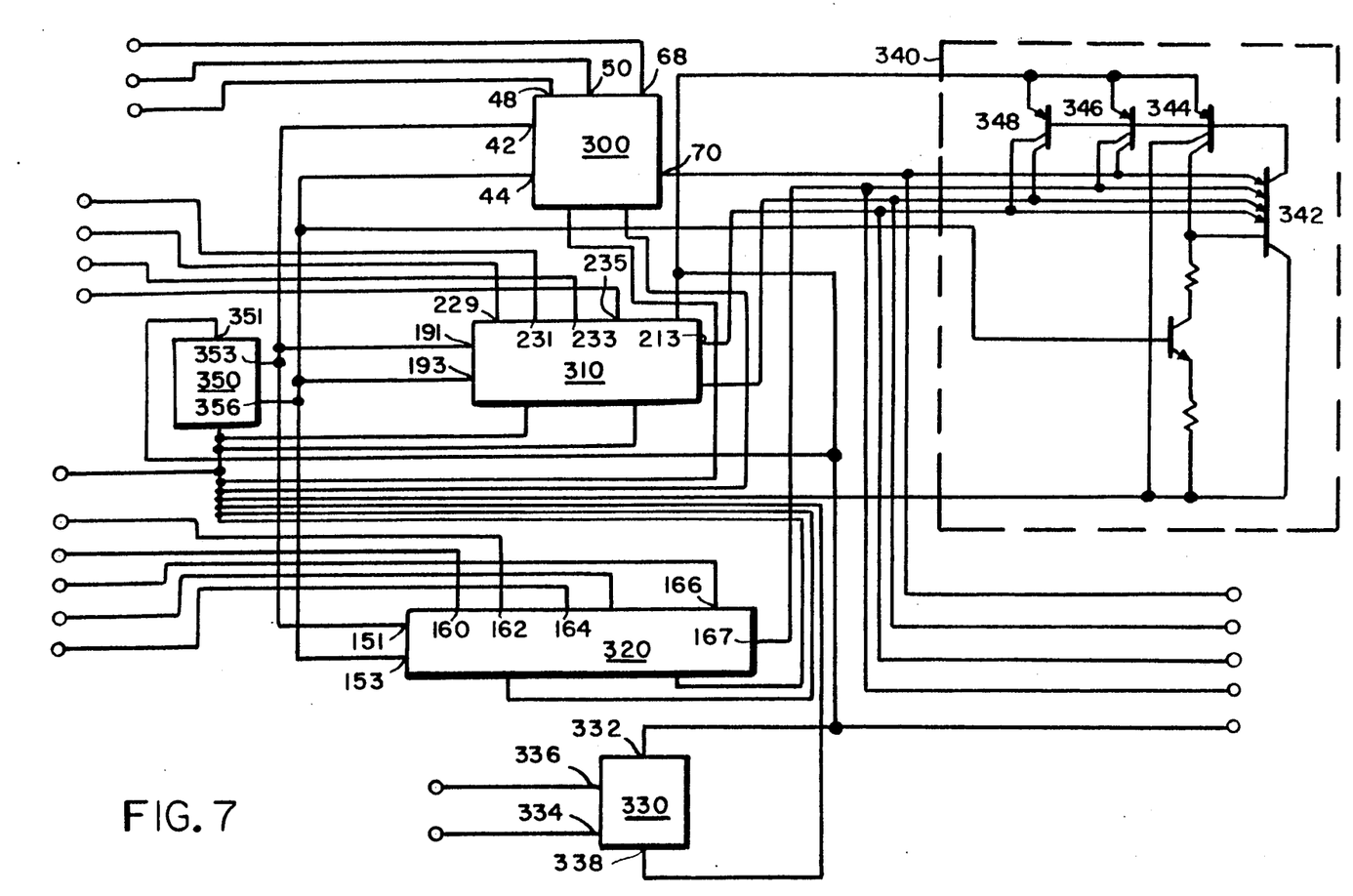
FIG. 7 is a schematic block diagram illustrating how the blocks shown in FIGS. 2, 5, and 6 are connected together to form the apparatus illustrated in FIG. 1.

FIG. 7 illustrates in schematic block diagram form how the various modules described in connection with FIGS. 2 through 6 are interconnected, in order to form the apparatus of the present invention. Functional blocks and connections which have already been described have been given the same reference numbers as used earlier, in order to clarify understanding the circuitry. Comparator 300 incorporates the circuitry described in conjunction with the operation of the circuit in FIG. 2. Comparator 310 incorporates the circuitry used to perform the functions described in connection with the circuitry of FIG. 6. Comparator 320 incorporates the circuitry used to perform the functions described in connection with the circuitry of FIG. 5.

Switch circuit 330 incorporates circuitry used to perform the functions illustrated by module 28 in FIG. 1. This circuit provides an on/off function with overvoltage and reverse voltage protection for the circuit. The limiting and switching functions of circuit 330 are intended to protect the circuit itself and any circuits driven by the power output terminal 332 from positive or negative power transients. During normal operation, the signal applied to terminal 334 can be used to control the power output terminal 332, which disables the other circuits by controlling the bias circuit 350.

Circuit 340 incorporates circuitry driven by the bias circuit 350 to provide pull-up voltages for the logic outputs of the integrated circuit. Extra emitters on transistor 342 act to limit the positive swing of the outputs to just below the voltage delivered by switch circuit 330 at terminal 332 in order to prevent current hogging and reinjection, which would occur if the split collectors of transistors 344, 346, and 348 went into saturation.

Figure 8:
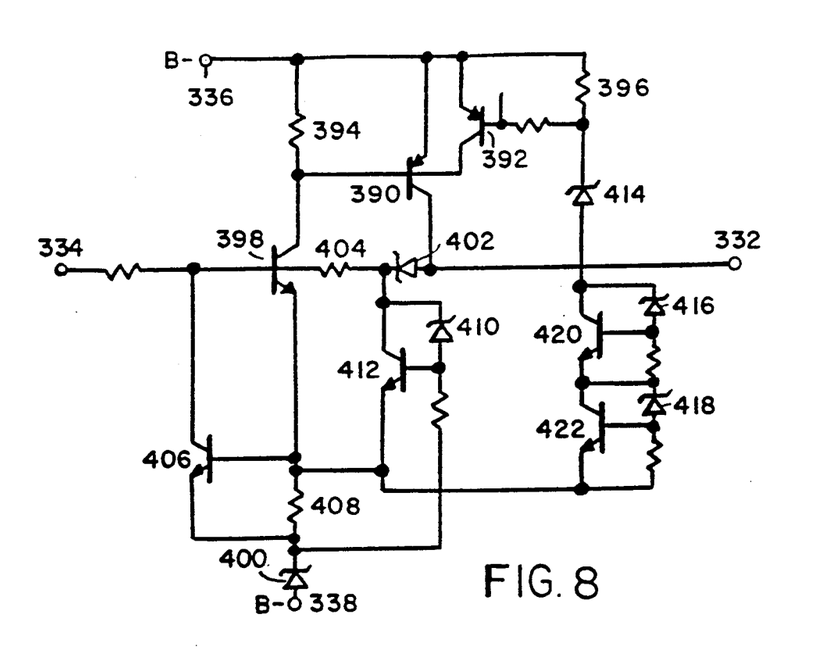
FIG. 8 is an illustrative schematic diagram of the switch circuit shown in FIG. 7.

Referring now to FIG. 8, an illustrative schematic diagram is shown which may be used to implement the function of the switch circuit 330 shown in block diagram form in FIG. 7. This circuit provides an on/off switch for the total integrated circuit and includes overvoltage and reverse voltage protection for the integrated circuit. The B+ or battery voltage is connected to terminal 336 and terminal 338 is connected to the B− or ground terminal. Power is delivered from terminal 332 to the rest of the integrated circuit. A signal at terminal 334 functions to switch the output on or off. In the "on" state, when the battery voltage is at a normal level, transistor 390 is saturated, and therefore the output voltage would closely track the B+ voltage. If the battery voltage exceeds approximately 16 volts, the base current to transistor 390 will start to be limited in order to bring transistor 390 out of saturation and to thereby limit the output voltage at terminal 332 to approximately 16 volts. If the B+ should rise above 30 volts, transistor 390 is switched off and transistor 392, which is connected between the B+ voltage and the base of transistor 390, is switched on and acts to prevent transistor 390 from conducting, even in the event of large transient voltages. If a reverse voltage transient occurs, the base emitter junctions of both transistor 390 and 392 are reversed biased. The input current will consequently be limited by resistors 394 and 396, which are connected to pockets (not shown) in the substrate. This voltage limiting and voltage switching function protects the switching circuit itself and all external circuits connected to terminal 332 from positive or negative power transients.

The operation of the switching circuit will now be explained in greater detail. When the voltage at terminal 334 is low, transistor 398 behaves as an emitter follower. As the voltage on the base of transistor 398 rises in response to a voltage increase at terminal 334, the emitter voltage of transistor 398 will approach the avalanche conducting voltage of Zener diodes 400 and 402. When the voltage on the emitter of transistor 398 exceeds 8 Volts, diodes 400 and 402 conduct in an avalanche mode, and therefore the collector current of transistor 398 can increase very rapidly. The collector current from transistor 398 is then delivered to the base of transistor 390, switching transistor 390 on. As the voltage at the collector of transistor 390 rises towards the B+voltage, diode 402 becomes forward biased, which supplies additional voltage to the base of transistor 398 through resistor 404. This regenerative action increases the base voltage at transistor 390 to drive it into voltage saturation. The regenerative action also has an additional benefit in that it provides some noise immunity at terminal 334 by inducing some hysteresis into the switching circuit. As a consequence, once terminal 332 rises to a voltage level approaching the B+voltage, the signal at terminal 334 must be reduced by several volts in order to overcome the hysteresis and switch transistor 398 off.

The effect of the regeneration circuit on transistor 398 must be limited in order to protect transistor 398 from delivering excessive output current. The output of transistor 398 is limited by transistor 406. Transistor 406 turns on when the voltage across resistor 408 caused by the increased emitter current of transistor 398 brings transistor 406 into the active region. Transistor 406 will consequently reduce the current available at the base of transistor 398, thereby limiting the output current delivered by transistor 398.

If the B+ voltage at terminal 336 exceeds approximately 16 Volts, the voltage at terminal 332 will be enough to forward bias diodes 402 and 410 into their respective forward conduction and avalanche conduction regions. Transistor 412 provides one extra base emitter voltage in order to raise the threshold conduction voltage of diode 410 one base emitter voltage. As the voltage level at terminal 332 becomes more positive, transistor 412 begins to conduct current away from the emitter of transistor 398. At the same time, as noted earlier, transistor 406 will limit the base current supplied to transistor 398, so that the collector current of transistor 398 will decrease. Consequently, the base current provided to transistor 390 will be reduced until an equilibrium condition is established with terminal 332 at approximately 16 Volts, and transistor 390 providing the load current. If a transient should occur which is too fast for this circuit to respond to, a low impedance path, including diode 400, the base-emitter connection of transistors 406 and 412, and diodes 410 and 402 will act to clamp the output voltage at terminal 332 to less than 18 Volts. This circuit protects the external circuits controlled and powered by the output voltage at terminal 332.

If very large transients occur on the B+voltage, another circuit including Zener diodes 414, 416, and 418 and the associated base emitter voltages of transistor 420 and 422 will become operational. This circuit is connected to the B+ voltage through resistor 396. As the B+ voltage exceeds approximately 30 volts, this circuit will become conductive. Current that would normally be supplied to transistor 398 would be conducted away, in order to reduce the current supplied to transistor 390. As a consequence, the voltage at output terminal 332 will decrease. If the B+voltage continues to increase, transistor 392 will be switched on, which will act to clamp the base voltage of transistor 390.

During normal operating conditions, the signal at terminal 334 can be used to turn off the output voltage at terminal 332 which will, in turn, disable the other circuits in the integrated circuit by shutting off the bias circuit 350 (as shown in FIG. 7). In order to turn the voltage at the output terminal 332 off, the voltage at terminal 334 is decreased, so that the voltage supplied to the base of the transistor 398 through resistor 424 decreases. As the voltage at terminal 334 continues to decrease, an external switching circuit (not shown) connected to terminal 334 will sink all of the current being provided at terminal 334 through resistor 404. Therefore, transistors 398, 390 and consequently the output at terminal 332 will be turned off, as the signal on terminal 334 drops below 6 Volts.

As noted in the objects of the invention, a significant feature of the present invention is that the comparators are biased so as to compensate for the effects of temperature on the resistances of the shunt resistors. Furthermore, the present invention also functions to compensate for power supply variations which may affect the desired voltage threshold in order to the sensitivity of the current comparators to changes in the supply voltage. These functions are accomplished by bias circuit 350 illustrated in FIG. 7. As shown in FIG. 7, bias circuit 350 receives power from switch circuit 330 at terminal 351. Bias circuit 350 delivers bias power at terminals 353 and 356.

Figure 9:
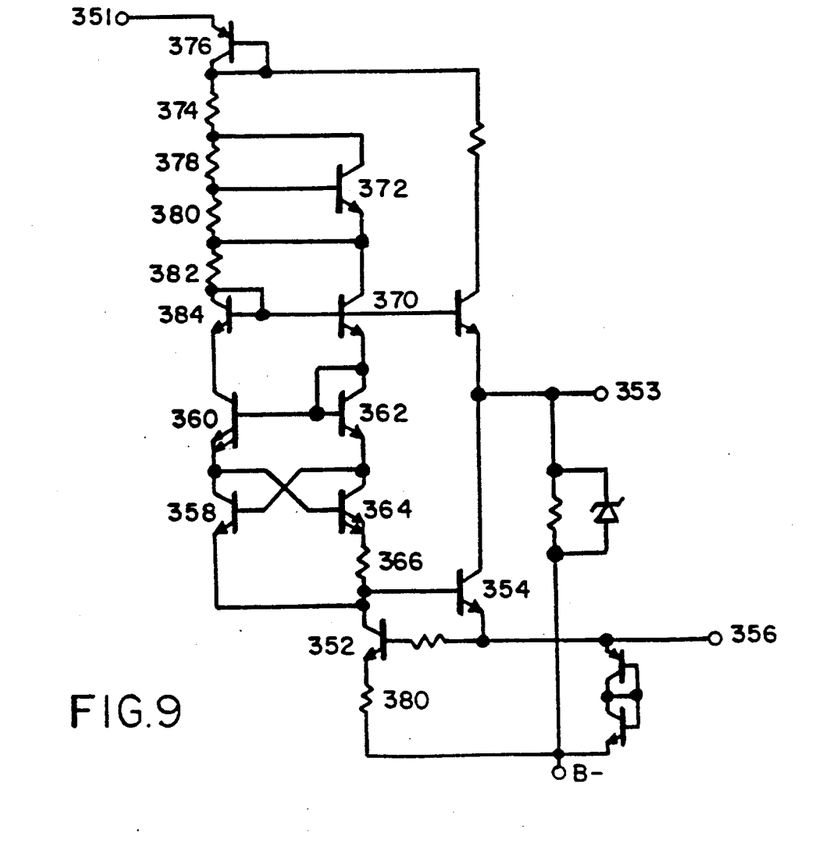
FIG. 9 is an illustrative schematic diagram of the bias circuit shown in FIG. 7.

Referring now to FIG. 9, an illustrative schematic diagram is shown which may be used to perform the functions of bias circuit 350.

As the supply voltage to the lamps varies, depending on the state of charge and load on the battery, the current drawn by the lamps will vary as well. Consequently, the nominal threshold for detecting whether or not a lamp is functional should also vary. Another complicating factor lies in that the lamp current is not directly proportional to the supply voltage, but varies approximately as the square root of the supply voltage. Therefore, the bias circuit illustrated in FIG. 9 incorporates a term sensitive to supply voltage, which modulates the PTAT bias in an approximate proportion to the square root of the supply voltage that is referenced to a 13.5 Volt nominal reference voltage.

In order to obtain this sensitivity, the bias circuit illustrated in FIG. 9 includes a servo circuit that controls the base voltage of transistor 352 so that it is a function of the current that transistor 352 sinks at its collector. Transistor 354 is connected to control the base voltage of transistor 352, so that transistor 352 will sink the applied current. This current consists of a first PTAT component, which varies proportionally to the supply voltage, and a second PTAT component which is invariant with respect to the supply voltage. The result of this control circuit is a bias current at output terminal 356 that varies at approximately half the rate of variation of the supply voltage. This is, in effect, a fifty percent sensitivity factor of bias current to supply voltage. This fifty percent sensitivity factor corresponds to the derivative of the square root function which is a good approximation of the variation of the lamp current.

Transistors 358, 360, 362, and 364 are connected as a crossed-quad circuit. These transistors are sized and connected to produce a voltage equal to (KT/g)/ln4 across resistor 366. This results in a PTAT component of current through the right side of the crossed-quad pair formed by transistors 362 and 364. This current is supplied by transistors 370 and 372 and also passes through resistor 374 and transistor 376, from the power in terminal 351.

The current for transistors 358 and 360 of the crossed quad connection comes from the power-in terminal 351 through transistor 376, and in turn through resistors 374, 378, 380, 382, and transistor 384. The base-emitter voltage of transistor 372 is applied across resistor 380. If the base current of transistor 372 is neglected, the resulting voltage that will appear across resistor 378 will be the ratio of the resistance of resistor 378 divided by the resistance of resistor 380 to the base emitter voltage of transistor 372. When transistor 372 conducts, its collector-emitter voltage will stabilize at $(1+R_{378}/R_{380})V_{BE}$, where $R_{378}$ is the resistance of resistor 378, $R_{380}$ is the resistance of resistor 380, and $V_{BE}$ is the base-emitter voltage of transistor 372. There will be an additional voltage added to this equation due to the base current of transistor 372. This combination of resistors and transistors adds a voltage that is complementary to absolute temperature, so that the total effect will be the equivalent of just over 11 base emitter junctions in this path.

The values of resistor 374 and 382 are selected to bring the total current in the left leg of the crossed quad connection to a desired value. The nominal voltage in this leg is arranged to be Just over 11 times the bandgap voltage. As a result, the current in the left leg of the crossed quad transistors will be approximately PTAT, at a nominal supply voltage. As a result of this circuit, the two components of the current which transistor 354 uses to control transistor 352, that is, the first PTAT component proportional to changes in supply voltage and the second PTAT component which is invariant with respect to the supply voltage, will be proportional to absolute temperature at the nominal supply voltage. Consequently, the output terminal 356 will have a voltage on it that will cause the transistors in the comparators of the integrated circuit to deliver a PTAT current as well.

The most important transistors to control in the comparators are transistors 72 and 74, illustrated, for example, in the basic comparator circuit shown in FIG. 3. The additional resistors 73 and 75, also shown in FIG. 3, are used to scale the current to approximately 10 uAmp at the nominal supply voltage and room temperature. Consequently, this current, which is proportional to absolute temperature, flows into the comparators and into resistors 86 and 88 shown in FIG. 3, to create the threshold switching voltage for the comparators. This threshold voltage has a temperature coefficient which is slightly greater than a PTAT temperature coefficient, because of the positive temperature coefficient of the diffused resistor 88.

If the supply voltage varies from the nominal supply voltage, the portion of current in transistor 352 and resistor 380 which comes from the left side of the crossed quad transistor connection (that is, the portion of the current that comes from the left leg of the crossed-quad connection, including transistors 358 and 360) will be modulated by the change in current since this current is proportional to the supply voltage. This change in current comes about because any change in supply voltage will change the voltage across resistors 374 and 382. The resulting change in current through these resistors, due to the change in supply voltage will change the current flowing through the left leg of the crossed quad connection. Consequently, any change in this current will vary the current through transistor 352 and resistor 380. As noted earlier, transistor 352 and resistor 380 also carry a second PTAT current component that is invariant with the supply voltage that comes from the right leg of the crossed-quad connection which includes transistors 362 and 364. The net result is that the servo circuit has a sensitivity of approximately 50% to supply voltage changes. Consequently, the bias current in the comparators varies approximately half as much as the variations in supply voltage.

In actual practice, the current density in transistor 352 is actually higher than the current density in transistors 72 and 74 of the comparators (illustrated, for example, in FIG. 3). The difference in current densities results in another component of PTAT voltage that is insensitive to supply voltage changes. Once this difference in actual current densities is taken into account, the proportion of the current that would be sensitive to supply voltage changes compared to the proportion of current that would be insensitive to supply voltage changes can be selected to fit the desired variation in the comparator threshold voltage, in order to track the nominal lamp current as closely as possible.

Compensating for the predictable variability which results from variation in the power supply voltage and the somewhat unpredictable variability that results from changes in the circuit temperature, helps preserve necessary noise margins. For example, these margins allow for the variability in the nominal shunt resistance due to variations in the thickness of the traces on the printed circuit board, variations in temperature between the shunt itself and the actual circuit temperature, and variations in threshold settings including drifts due to component variations in the circuit itself.

The lamp monitoring apparatus of the present invention may be manufactured using integrated circuit technology to enhance reliability and accuracy. One skilled in the art will also appreciate that the comparators of the lamp monitoring apparatus may be logicallly connected together or they may be operated separately depending upon the number of lamp circuits that require monitoring and the operation of the circuits.

Having thus described the one particular embodiment of the invention, various alterations, modifications, and improvements will readily occur to those skilled in the art. In particular, one skilled in the art will appreciate that the temperature compensated threshold switching voltage of the comparators of the present invention and the reduced sensitivity of the circuit to supply voltage changes can be applied to circuits used in areas outside of automobile electrical systems Such alterations, modifications, and improvements as are made obvious by this disclosure are intended to be part of this description, although not expressly stated herein, and are intended to be within the spirit and scope of the invention. Accordingly, the foregoing description is by way of example only, and not limiting. The invention is limited as defined in the following claims and equivalents thereto.

What is claimed is:

1. In a circuit including a shunt comprising resistance means having a first end and a second end, the first end being connected to a current source and the second end being connected to a lamp, an apparatus for monitoring current through the lamp circuit comprising:
    a comparator means having first and second input terminals, the first terminal being connected to the first end of the shunt, and the second terminal being connected to the second end of the shunt;
    the comparator means having a threshold switching voltage, so that a voltage across the shunt means larger than the threshold voltage will switch the comparator means on, and a voltage across the shunt means smaller than the threshold voltage will switch the comparator means off; and
    a temperature compensation means connected to the comparator means for maintaining the threshold switching voltage in a fixed relationship with the temperature of the shunt means.

2. The apparatus of claim 1 further comprising supply voltage sensitivity control means connected to the comparator means for controlling a sensitivity of the threshold switching voltage of the comparator means to changes in an apparatus supply voltage.

3. The apparatus of claim 2, wherein the apparatus is incorporated into a monolithic integrated circuit means.

4. The apparatus of claim 1, wherein the shunt means comprises a portion of a printed circuit board trace.

5. A temperature-compensated lamp monitoring circuit, for monitoring current through a resistance shunt in the lamp circuit, comprising:
- a comparator having two output states, the comparator having first and second inputs connected to first and second ends of the shunt and being responsive to a voltage developed across the shunt so that the comparator assumes one of its two output states when the voltage developed across the shunt exceeds a threshold switching voltage and the other of its two output states when the voltage developed across the shunt is less than the threshold switching voltage; and
- a biasing means, connected to and controlling the comparator means, for temperature compensating the threshold switching voltage, due to changes in a temperature of the shunt, such that the threshold switching voltage changes proportionally to absolute temperature, and for controlling a sensitivity of the threshold switching voltage to changes in a supply voltage of the circuit.

6. The lamp monitoring circuit of claim 5, wherein the sensitivity of the threshold switching voltage varies as a square root function of the change in the circuit supply voltage.

7. The lamp monitoring circuit of claim 5, wherein the sensitivity of the threshold switching voltage varies as one-half the change in the circuit supply voltage.

8. The lamp monitoring circuit of claim 5, wherein the sensitivity of the threshold switching voltage varies as a derivative of a square root of the change in the circuit supply voltage.

9. The lamp monitoring circuit of claim 5, wherein the shunt comprises a printed circuit board trace.

10. The lamp monitoring circuit of claim 9, wherein the printed circuit board trace is copper.

11. The lamp monitoring circuit of claim 5, further comprising at least one fuse test circuit.

12. The lamp monitoring circuit of claim 5, further comprising at least one circuit for testing a lamp in a non-operational state.

13. The lamp monitoring circuit of claim 5, further comprising a plurality of comparator means, connected to and controlled by the biasing means, for monitoring a plurality of currents in a plurality of respective lamp circuits.

14. The lamp monitoring circuit of claim 13, wherein the lamp monitoring circuits are constructed as a monolithic integrated circuit.

15. The lamp monitoring circuit of claim 5, wherein the lamp monitoring circuit is constructed as a monolithic integrated circuit.

16. In a circuit including a shunt comprising a resistance means having a first end and a second end, the first end being connected to a current source and the second end being connected to a load, an apparatus for monitoring current through the load circuit, comprising:
- a comparator having two output states selected in relation to a threshold switching voltage, and having inputs connected to make the comparator responsive to a voltage developed across the shunt, so that a voltage across the shunt larger than the threshold switching voltage causes the comparator output to assume a first one of the two output states and a voltage across the shunt smaller than the threshold switching voltage causes the comparator output to assume the second one of the two output states; and
- a temperature compensation means, connected to the comparator means, for temperature compensating the threshold switching voltage changes, due to changes in a temperature of the shunt, such that the threshold switching voltage proportionally to absolute temperature.

17. The apparatus of claim 16, wherein the lamp monitoring circuit is incorporated into a monolithic integrated circuit.

18. The apparatus of claim 17, wherein the shunt comprises a portion of a printed circuit board trace.

19. In a circuit including a shunt comprising resistance means having a first end and a second end, the first end being connected to a current source and the second end being connected to a load, an apparatus for monitoring current through the circuit, comprising:
- a comparator having two output states selected in relation to a threshold switching voltage, and having inputs connected to make the comparator responsive to a voltage developed across the shunt, so that a voltage across the shunt larger than the threshold switching voltage causes the comparator to assume a first one of the two output states and a voltage across the shunt smaller than the threshold switching voltage causes the comparator to assume the second one of the two output states; and
- a sensitivity control means, connected to the comparator means, for controlling a sensitivity of the threshold switching voltage to changes in a supply voltage of the circuit.

20. The apparatus of claim 19, wherein the lamp monitoring circuit is incorporated into a monolithic circuit.

21. The apparatus of claim 20, wherein the shunt means comprises a portion of a printed circuit board trace.

* * * * *